United States Patent [19]

Adams

[11] Patent Number: 4,668,918

[45] Date of Patent: May 26, 1987

[54] LOW ORDER CHARGE-PUMP FILTER

[75] Inventor: Neil R. Adams, San Francisco, Calif.

[73] Assignee: Advanced Micro Devices, Inc., Sunnyvale, Calif.

[21] Appl. No.: 697,374

[22] Filed: Feb. 1, 1985

[51] Int. Cl.[4] .................. G01R 25/00; H03L 7/08
[52] U.S. Cl. ............................. 328/155; 328/127; 328/133; 307/511; 331/17; 331/25
[58] Field of Search ................ 331/17, 25, 27; 307/494, 510, 511, 353, 236, 321; 328/127, 151, 155, 133; 333/165

[56] References Cited

U.S. PATENT DOCUMENTS

| | | | |
|---|---|---|---|
| 3,857,108 | 12/1974 | Kanow | 331/25 |
| 4,151,473 | 4/1979 | Coleman et al. | 328/151 |
| 4,166,984 | 9/1979 | Jenkins | 331/17 |
| 4,238,740 | 12/1980 | Crue | 331/17 |
| 4,450,410 | 5/1984 | Kliger et al. | 331/25 |
| 4,484,089 | 11/1984 | Viswanathan | 328/151 |
| 4,506,233 | 3/1985 | Englund | 331/17 |
| 4,523,150 | 6/1985 | Hogeboom | 307/511 |
| 4,546,330 | 10/1985 | Okada | 331/25 |

Primary Examiner—John S. Heyman
Attorney, Agent, or Firm—Patrick T. King; Mark A. Haynes; J. Vincent Tortolano

[57] ABSTRACT

The present invention discloses a low order charge-pump filter operable with a single variable current source. The integrating capacitor of the charge-pump is connected in an H-bridge switching configuration with four switches that are operable to control the current source to supply current to a first node of the capacitor or to a second node of the capacitor or to bypass a capacitor, depending on the state of operation of the charge-pump. The charge-pump filter disclosed is particularly useful for providing the low order response for a phase detector in a phase-locked loop.

26 Claims, 6 Drawing Figures

LOW ORDER CHARGE-PUMP FILTER

FIELD OF THE INVENTION

The present invention relates to charge-pump filters for converting timed-logic events into an analog signal for use in control circuitry, such as phase-locked loops.

BACKGROUND OF THE INVENTION

In the processing of information generally, it is often necessary to compare two different signals to accomplish a variety of purposes. The comparison may result in the generation of an error signal representing the difference between the two signals. Circuitry may then respond to the error signal to minimize this difference between the two signals or perform some other function based on this difference.

For example, a phase detector is conventionally used to detect the difference in phase between two signals. The phase detector may be used in a phase-locked loop that, among other components, includes a voltage controlled oscillator (VCO) whose output is a reference frequency signal having a frequency determined by an input control signal. The phase detector receives a stream of data pulse signals, together with the reference frequency signal, which is fed back from the VCO. Any difference in phase between a data pulse signal and the reference frequency signal results in the generation of a phase error signal that is filtered and then used to control the VCO in order to lock the reference frequency signal in phase with the stream of data pulse signals.

Phase-locked loops often incorporate digital or sequential logic phase detectors that generate digital signals corresponding to the difference in phase between the reference frequency signal and the data pulse signal. The digital output from the digital phase detectors typically must be converted to an analog signal for controlling the VCO. Thus, a charge-pump may accompany the digital phase detector to convert the logic states of the phase detector into analog signals suitable for controlling the VCO. A theoretical discussion of prior art charge-pumps can be found in Floyd M. Gardner, "Charge-pump Phase-lock Loops", IEEE TRANSACTIONS ON COMMUNICATIONS, Volume COM-28, Number 11, November 1980. Gardner discusses the operation of charge-pump filters in the phase-locked loop environment.

One problem with prior art charge-pump filters resides in the necessity to include at least two current sources, one to charge up the capacitor in the charge-pump, and one to pull down the charge in the capacitor. Both of the current sources are required to match identically in order to avoid drift in the charge-pump and the introduction of other errors because of unbalanced charge up and charge down. This problem is particularly acute in the implementation of a low order filter for a phase-locked loop. The very low integration rates involved in low order charge pumps can be interfered with by mis-matched current sources.

In addition, prior art filters have been designed with a set bandwidth. However, for many applications, a variable bandwidth charge-pump filter is desirable.

When used as a phase detector, a difficulty arises in the prior art for many types of data pulse streams, such as MFM disk data, in which for a given period of the reference frequency signal from the VCO, no data pulse signals will occur. These missing data pulse signals can cause the phase detector to malfunction.

A prior approach to preventing malfunction due to missing data pulse signals is to arm the phase detector only if a data pulse signal occurs and to disarm the phase detector if a data pulse signal does not occur during the bit time. This technique uses a time delay device which receives in real time the stream of data pulse signals and outputs to the phase detector delayed data pulse signals which are to be compared to the reference frequency signal of the VCO. The phase detector also receives in real time the stream of data pulse signals for arming purposes.

Thus, in operation, the data pulse stream is fed to the input of the time delay device as well as to the phase detector. If a data pulse signal occurs, the phase detector is armed and then, a short time later, receives the same, but delayed, data pulse signal which had been delayed by the time delay device. This delayed data pulse signal is then compared with the reference frequency signal to produce the phase error signal. However, if no data pulse signal occurs during the bit time, the phase detector is not armed, so that it does not operate for phase detection purposes.

One problem with the prior solution is the requirement of a time delay device. In addition to requiring a time delay device which may be expensive, the delay must be precise, so as to have the phase detector properly compare its two input signals. The realization of such a precision time delay is not always easily accomplished. Also, the delay should be equal to one-half the cycle of the nominal frequency of the VCO. Therefore, if the nominal frequency of the VCO is to be changed, which may require using a different VCO in the phase-locked loop, then a new time delay device may be needed in view of the requirement that the delay be equal to one-half the cycle of the nominal frequency. Still furthermore, the arming and disarming of the phase detector has the disadvantage of causing the phase detector to change state between an operative or armed condition and a non-operative or disarmed condition.

SUMMARY OF THE INVENTION

The present invention provides a low order charge-pump filter having a single current source, an electronically variable bandwidth, and that is operative whether or not a data pulse signal occurs during a given period.

The present invention is an apparatus generating an analog signal comprising a charge storage device connected across the first node and a second node, current source means for supplying a current at a third node; switching means, responsive to control signals, for switching the current from said current source means to control the voltage level of said first node and said second node; and means for supplying the control signals.

In the preferred embodiment, the switching means includes a first switch, a second switch, a third switch and a fourth switch. The first switch is connected from the first node to a reference voltage, such as $V_{CC}$. The second switch is connected from the second node to the reference voltage. The third switch is connected from the first node to the third node at which the current source supplies current. The fourth switch is connected from the second node to the third node at which the current source supplies current.

The low order charge-pump is controllable to operate as a phase detector which is operable whether or not a data pulse signal occurs during a bit-period.

Furthermore, in one preferred embodiment a dynamically variable current source is included so that the bandwidth of the low order charge-pump filter can be varied dynamically.

DETAILED DESCRIPTION

With reference to the Figures, a detailed description of the present invention is provided.

Figure 1:
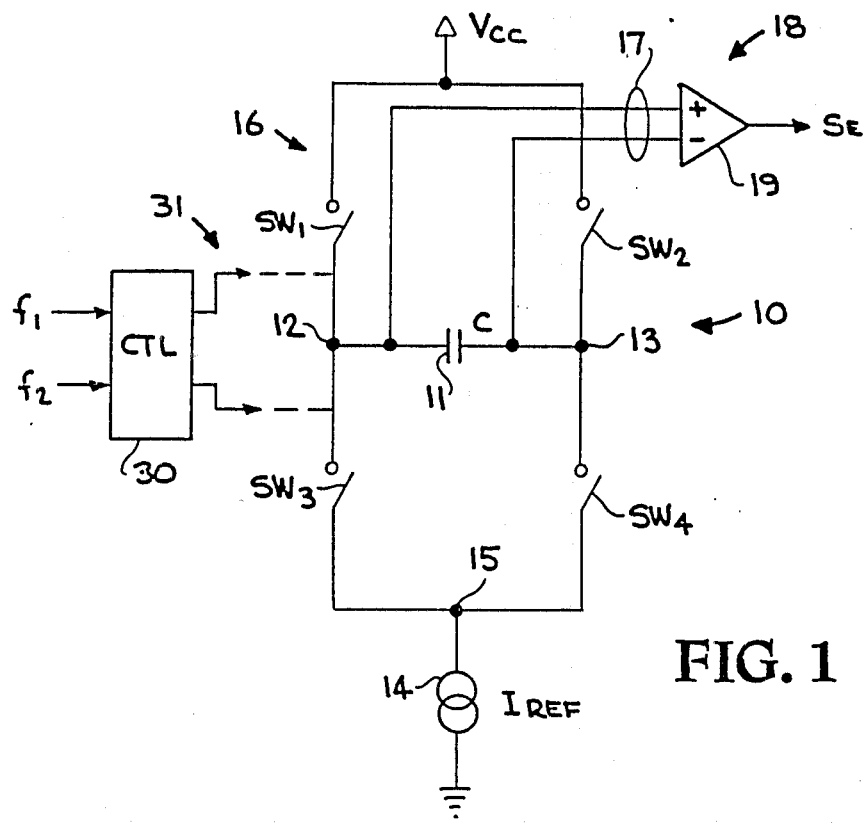
FIG. 1 is a simplified schematic diagram of the present invention.

FIG. 1 shows an overview of the present invention. The invention includes a charge-pump apparatus 10 including a charge storage device C, such as a capacitor 11 connected between a first node 12 and a second node 13. Also included is a current source means 14 for supplying a current $I_{REF}$ to a third node 15.

Also included is a switching means 16, that includes four switches, $SW_1$, $SW_2$, $SW_3$ and $SW_4$ for controlling the supply of current at the first node 12 and the second node 13. The first switch $SW_1$ is connected from the reference $V_{CC}$ to the first node 12. The second switch $SW_2$ is connected from the reference $V_{CC}$ to the second node 13. The third switch $SW_3$ is connected from the third node 15 to the first node 12. The four switch $SW_4$ is connected from the third node 15 to the second node 13.

The differential voltage generated across the capacitor 11 is a bipolar analog signal on lines 17, the value of which is controllable by the switch means 16. The bipolar analog signal 17 can be supplied to a means 18, such as amplifier 19, for generating an output error signal $S_E$.

The charge pump apparatus 10 is controlled by control means 30 to function in three states. The control means 30 generates control signals 31 to set the state of the switching means 16.

In the first state, switch one $SW_1$ and switch three $SW_3$ are closed, or alternatively switch two $SW_2$ and switch four $SW_4$ are closed. In this first state, the error signal $S_E$ remains constant because no current is supplied to charge up or down the capacitor 11. In some embodiments, it is desirable to alternate in this first state between the condition of $SW_1$ and $SW_3$ closed and the condition of $SW_2$ and $SW_4$ closed to balance any charge leakage that may occur. To simplify the description, the first state is assumed not to alternate condition.

The second state, involves switch two $SW_2$ and switch three $SW_3$ being closed, while switch one $SW_1$ and switch four $SW_4$ are open. In this second state, the error signal $S_E$ will be pumped down, because current will be removing charge from the positive node 12 of the capacitor 11.

The third state involves switch one $SW_1$ and switch four $SW_4$ being closed while switch two $SW_2$ and switch three $SW_3$ are open. In this third state, the error signals $S_E$ will be pumped up because current will be withdrawing charge from the negative node 13 of the capacitor 11.

Figure 2:
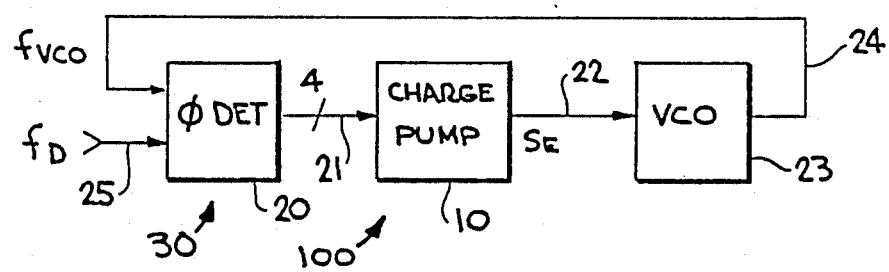
FIG. 2 is a block diagram of a phase-locked loop according to the present invention.

This three state charge-pump apparatus 10 is suitable for use in a phase-locked loop 100 as shown in FIG. 2.

The phase-locked loop 100 includes a digital phase detector 20 as the control means 30, which generates control signals on line 21, for controlling the charge-pump apparatus 10. The charge-pump apparatus 10 receives the digital control signals across line 21 to generate the error signal $S_E$ on line 22. The error signal is used to drive the voltage controlled oscillator VCO 23, which generates a reference frequency signal $f_{VCO}$ on line 24, which feeds back to the phase detector 20. A data stream $f_D$ is received by the phase detector on line 25.

The phase detector 20 generates control signals on line 21 in response to the difference in phase of the reference frequency signal $f_{VCO}$ and the data stream $f_D$. The control signals drive the charge-pump apparatus 10 to generate an analog error signal $S_E$ for driving the VCO 23, such that the reference frequency signals $f_{VCO}$ supplied over line 24 will be locked in phase with the data stream $f_D$.

Figure 3:
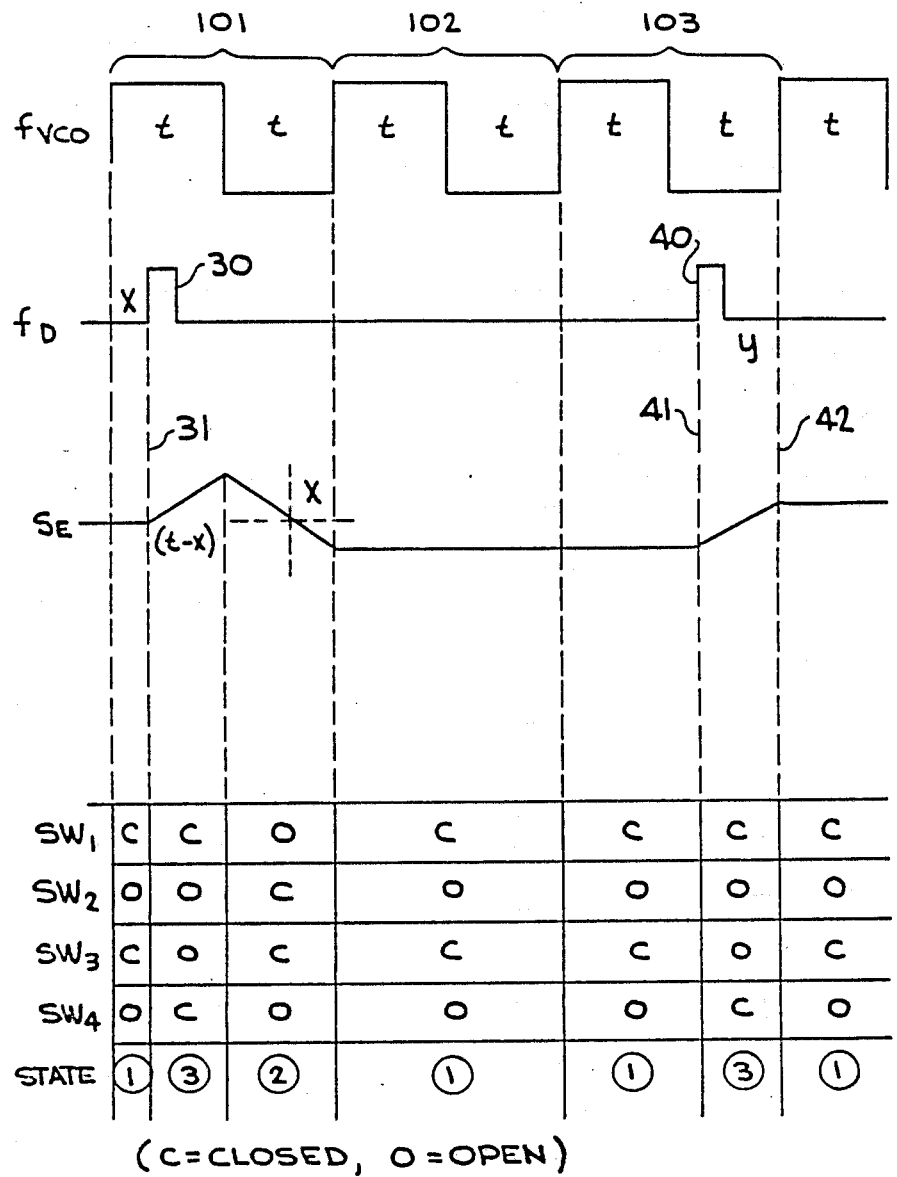
FIG. 3 is a graph used in explanation of the present invention.

FIG. 3 is used to illustrated the switching sequence of the charge-pump apparatus 10 for use with a phase-locked loop apparatus 100.

The reference frequency signal $f_{VCO}$ is shown as a square wave having a period 2t, thus each half-period has a length of t.

The data stream $f_D$ is shown in three conditions. The first condition 101 shows the data pulse signal 30 arriving during the positive half-cycle of the frequency pulse signal $f_{VCO}$ and out of phase by a time x. In this first condition 101, the state of the charge-pump apparatus 10 is controlled as follows. While no data pulse occurs during the first half-cycle of the frequency pulse signal $f_{VCO}$, the charge-pump apparatus 10 remains in the first state, such as switch one $SW_1$ and switch three $SW_3$ closed, with switch two $SW_2$ and switch four $SW_4$ open. Thus the error signal $S_E$ will remain constant until the data pulse signal 30 is received. On the leading edge 31 of the data pulse signal 30, the charge-pump apparatus 10 is switched to the third state, in which switch one $SW_1$ and switch four $SW_4$ are closed, while switch two $SW_2$ and switch three $SW_3$ are open. In this third state, the error signal $S_E$ is pumped up for a time $(t-x)$. At the beginning of the second half-cycle of the frequency signal $f_{VCO}$, the state of the charge-pump apparatus 10 changes to the second state, in which switch two $SW_2$ and switch three $SW_3$ are closed while switch one $SW_1$ and switch four $SW_4$ are open. In this second state, the error signal $S_E$ is pumped down at a rate equal to the rate which it was pumped up for the duration t of the second half-cycle of the frequency pulse signal $f_{VCO}$. At the end of the second half-cycle, the charge-pump returns to the first state. The net result is the error signal $S_E$ will have been pumped down for a time x, so that the output of the VCO will be slowed down in order to lock on with the data stream $f_D$.

The second condition 102 involves a period of the frequency pulse signal $f_{VCO}$ in which no data pulse is received. In this second condition 102, the charge-pump apparatus 10 is maintained in its first state, such as switch one $SW_1$ and switch three $SW_3$ closed with switch two $SW_2$ and switch four $SW_4$ are open. In this manner the error signal $S_E$ is not changed during the period of the frequency pulse signals $f_{VCO}$ in which no data signal is received.

The third condition 103 involves a data pulse signal 40 which is received during the second half-cycle of the frequency pulse signal $f_{VCO}$. In this third condition 103, the charge-pump apparatus 10 remains in its first state, such as switch one $SW_1$ and switch three $SW_3$ closed with switch two $SW_2$ and switch four $SW_4$ open. Thus the error signal $S_E$ remains constant until the leading edge of the data pulse signal 40. When the leading edge of the data pulse signal 40 occurs during the second half-cycle of the frequency pulse signal $f_{VCO}$, the charge-pump apparatus switches to its third state, in which switch one $SW_1$ and switch four $SW_4$ are closed while switch two $SW_2$ and switch three $SW_3$ are open. This causes the error signal $S_E$ to be charged up until the leading edge 42 of the next cycle of the frequency signal $f_{VCO}$. Thus the error signal $S_E$ will be charged up for a time y, which equals to the amount of time that the data pulse signal leads the leading edge 42 the frequency signal, and causes the VCO to speed up in order to lock on to the data pulse signal $f_D$. At the leading edge 42 of the next frequency pulse signal, the charge-pump apparatus returns to its first state.

The bandwidth of the charge-pump apparatus 10, according to the present invention, can be varied by varying $I_{REF}$ supplied by the current source 14 (see FIG. 1). By varying $I_{REF}$, the slope of the pump up and pump down cycles on signal $S_E$ can be varied. By varying the slope of the pump up and the pump down cycles, the responsiveness of the error signal $S_E$ to phase errors increases for a given frequency of the frequency pulse signals $f_{VCO}$ and a given capacitance of capacitor C. Thus, for higher frequency operation with equivalent responsiveness in the error signal SE, the value of $I_{REF}$ must be increased.

Figure 4:
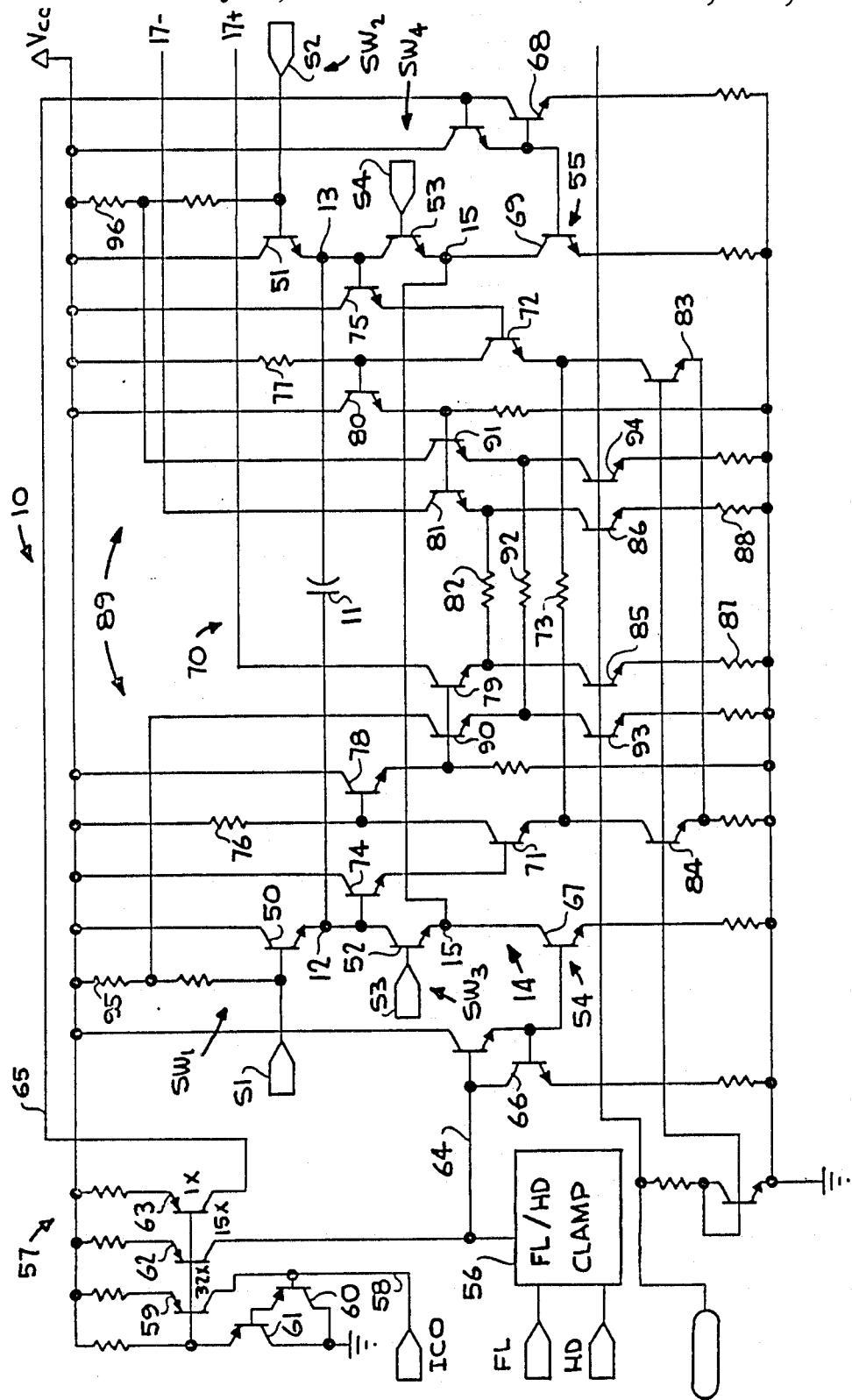
FIG. 4 is a detailed circuit diagram of a preferred embodiment of the present invention.

FIG. 4 shows a detailed circuit diagram of a charge-pump apparatus 10 according to the present invention which is operable over a wide range of frequencies. The particular implementation, shown in FIG. 4, is suitable for manufacture as an integrated circuit. The charge-pump apparatus 10 in FIG. 4 operates as a low order charge-pump filter in a phase-locked loop that is controllable to receive data stream $f_D$ from magnetic storage devices which include encoded data that may or may not have a data pulse during a given period of the reference frequency signals $f_{VCO}$ output by the VCO. Furthermore, the frequency of the data stream $f_D$ for a given magnetic storage device may not be the same frequency as for a different device. For instance, a floppy disk may operate at a frequency which is about 1/16 the frequency a hard disk in conventional disk drives. The circuit shown in FIG. 4 is operable specifically to receive data from either a floppy disk FL or a hard disk HD. When receiving data from a floppy disk the apparatus of FIG. 4 has a bandwidth suitable for the lower frequency operation; while when receiving data from the hard disk, the bandwidth of the charge-pump apparatus 10 in FIG. 4 is suitable for the higher frequency operation. The sizes of the transistors, resistors and capacitors shown in the figure are approximate values for floppy disk and hard disk operation. Of course, the circuit can be adapted to operate in a wide range of applications and wide range of frequencies as needed.

The apparatus 10, shown in FIG. 4 includes the capacitor 11 connected across the first node 12 and the second node 13. First switch $SW_1$ is implemented with transistor 50, having its emitter connected to the first node 12, and its collector connected to the reference voltage $V_{CC}$. The base of the transistor 50 receives a logic signal S1 for controlling the state of the first switch $SW_1$. The logic signal S1 is a current that controls the voltage level of the base of transistor 50.

The second switch $SW_2$ is implemented with transistor 51, having its emitter connected to the second node 13 and its collector connected to the reference voltage $V_{CC}$. The base of the transistor 51 is connected to a logic signal S2 for controlling the state of the second switch $SW_2$. The logic signal S2 is a current for controlling the voltage level of the base of transistor 51.

The third switch $SW_3$ is implemented with transistors 52 having its emitter connected to the third node 50 and its collector connected to the second node 12. The base of the transistor 52 is connected to the logic signal S3 for controlling the state of switch three $SW_3$. The logic signal S3 is a voltage that varies the level of the base of transistor 52.

The fourth switch $SW_4$ is implemented with transistor 53, having its emitter connected to the third node 15, and its collector connected to the second node 13. The base of transistor 53 is connected to the logic signal S4 for controlling the state of switch four $SW_4$. The logic signal S4 is a voltage for controlling the level of the base of transistor 53.

The current source means 14, in the embodiment shown in FIG. 4, includes a first variable current source 54 and a second variable current source 55. The first variable current source 54 and the second variable current source 55 supply current to the third node 15. The sum of the currents from the first variable current source 54 and the second variable current source 55 is equal to $I_{REF}$ and determines the bandwidth of the charge-pump apparatus 10 in FIG. 4.

A fist variable current source 54 and a second variable current source 55 are used in the implementation in FIG. 4 in order to accomplish a frequency response which is suitable for both floppy disks and hard disks. When operating in the floppy disk mode, the second variable current source 55 is enabled, while the first variable current source 54 is disabled by floppy/hard clamp 56. Floppy/hard clamp receives control signals FL and HD indicating the desired state of operation of the apparatus 10. When in the floppy mode FL, the floppy/hard clamp 56 disables the first variable current source 54. However, while in the hard disk mode HD, a higher $I_{REF}$ is necessary, so that floppy/hard clamp 56 enables the first variable current source 54, so that the sum of the currents from the first variable current source 54 and the second variable current source 55 is supplied to the third node 15.

A current scaling means 57 operates to scale $I_{REF}$ supplied by the first variable current source 54 and the second variable current source 55. The current scaling means 57 receives a reference current ICO on line 58 which is set to indicate the nominal data rate of the data stream. Thus the current ICO flow through the collector of the pnp transistor 59, which has an emitter area 32 times (32×) the standard emitter area 1× for transistors in the integrated circuit. Thus for a given emitter base voltage, the emitter current will be approximately 32 times the current for an equivalent emitter base voltage through a standard 1× transistor, such as transistor 63 connected in current mirror relationship.

The emitter follower transistors 60 and 61 operate to provide base current for transistors 59, 62, and 63 while minimizing drain from the current ICO.

Transistors 62 (15×) and 63 (1×) are current mirrors of transistors 59. The emitter resistors of each transistor 59, 62 and 63 are 9.3k/32, 9.3k/15 and 9.3k, respectively. Thus the current flowing through the collector of transistor 62 will be 15/32 ICO and the current flowing through the collector of transistor 63 will be 1/32 ICO.

Accordingly, 15/32 ICO is flowing on line 64 and 1/32 ICO is flowing on line 65. The first variable current source 54 thus receives 15/32 ICO through the collector of transistor 66 (20×). This causes 1/20 of the current on line 64 ((1/20)(15/32)ICO) to flow through the collector of transistor 67 (1×) connected in current mirror relationship with transistor 66, which supplies current to the third node 15.

In a similar manner, the current flowing through line 65 is caused to flow through the collector of transistor 68 (20×). This causes, through the current mirror effect, 1/20 of the current on line 65 ((1/20(1/32)ICO) to flow through the collector of transistor 69 (1×), which feeds the third node 15.

Thus in the hard disk mode, with both the first variable current source 54 and the second variable current source 55 enabled, the current flowing at the third node 15 is equal to the sum of 1/20 (15/32 ICO) pulse 1/20 (1/32 ICO). In the floppy disk mode, the floppy/hard clamp 56 clamps the current from line 64 to disable the first variable current source 54. Thus in the floppy disk mode, the current supplied to the third node 15 is equal to the current supplied to the second variable current source 55, or 1/20 (1/32 ICO).

In sum, the current scaling means 57, allows the charge-pump apparatus 10, shown in FIG. 4, to operate in a low frequency, or floppy disk, range and a high frequency, or hard disk, range. Furthermore, in both the floppy disk range and the hard disk range, by varying the value of ICO, precise dynamic control of the bandwidth of the charge-pump apparatus 10 is attained.

In the embodiment shown in FIG. 4, the output is supplied as a differential signal across lines 17+ and 17−. The differential signal across lines 17+, 17− is supplied by a differential amplifier means 70, which includes a two-stage differential amplifier circuit.

The first differential amplifier stage includes transistor 71 and transistor 72 having their emitters coupled across a resistor 73. Transistor 71 receives the voltage from the first node 12 through emitter follower transistor 74. Likewise the transistor 72 receives the voltage from the second node 13 through emitter follower transistor 75. The difference in voltage in the first node 12 and the second node 13 is translated into a differential current through the collector resistors 76, 77 and the collectors of transistor 71 and transistor 72, respectively. A higher voltage at the first node 12, than at the second node 13 will result in a higher current through the collector resistor 76 than through the collector resistor 77, and visa-versa.

The voltage at the collector of transistor 71 from the first differential amplifier stage is supplied through an emitter follower transistor 78 to the transistor 79 of the second differential amplifier stage. Similarly, the voltage at the collector of the transistor 72 from the first differential amplifier stage is supplied through an emitter follower transistor 80 to the transistors 81 of the second differential amplifier stage. The emitters of transistor 79 and 81 of the second differential amplifier stage are coupled across resistor 82.

The emitters of the transistor 71 and 72 of the first differential amplifier stage are connected to identical current source transistors 83 and 84, which are biased to provide a smaller driving current to the first differential amplifier stage.

The emitters of transistors 79 and 81 of the second differential amplifier stage are connected through current source transistors 85 and 86, respectively, and current source resistors 87 and 88 respectively to ground. The current source transistors 85 and 86 are referenced to $V_{CS}$ causing a driving current to flow through the current sources 85 and 86. $V_{CS}$ is a reference voltage for driving current sources in the integrated circuit, such as for driving ECL logic gates.

The charge-pump apparatus 10, shown in FIG. 4, also includes biasing means 89, for maintaining the base of the transistors 50 and 51 at an acceptable bias point. This enables the apparatus to switch over small switching voltages, less than an ECL voltage swing, thus minimizing feed through to the capacitor 11. Thus a third differential amplifier stage, made up of transistors 90 and 91 having their emitters coupled across resistor 92 and being driven by current source transistors 93 and 94 respectively, is included. The third differential amplifier stage receives voltage from the emitter follower transistors 78 and 80 and is effective to generate currents through the collectors of transistors 90 and 91 that is proportional to the difference in voltage at the emitters of transistors 78 and 80. The higher the voltage at the node 12, the lower the current drawn through the collector transistor 90. Likewise, the lower the voltage at the node 13, the higher the current drawn through the collector of transistor 91.

The current from the collector of transistor 90 is supplied to draw current through the resistor 95. Likewise, the current from the collector of transistor 91 is supplied to draw current through resistor 96. A smaller current through transistor 95 will result in a higher bias level for the base of transistor 50, corresponding to the higher level of the node 12. A larger current through resistor 96 results in a lower bias level for the base of transistor 51, corresponding to the lower bias level of the node 13. In this manner the first switch SW₁ and the second switch SW₂ are maintained in proper bias for switching by a logic current signal S1,S2.

In sum, the apparatus 10 shown in FIG. 4, is an integrated circuit comprising a low order charge-pump phase detector suitable for use in phase-locked loop apparatus. In the preferred implementation, the differential current supplied across line 17+, 17− is summed with the output of a high order charge-pump phase detector to provide a preferred response for the phase-locked loop. One suitable high order phase detector and filter is described in the related U.S. patent application entitled IMPROVED PHASE DETECTOR AND PHASE-LOCKED LOOP APPARATUS, filed in conjunction herewith, invented by Neil R. Adams, and owned by an assignee in common with the present application. The IMPROVED PHASE DETECTOR AND PHASE-LOCKED LOOPED APPARATUS application is incorporated by reference as if fully set forth herein.

Figure 5:
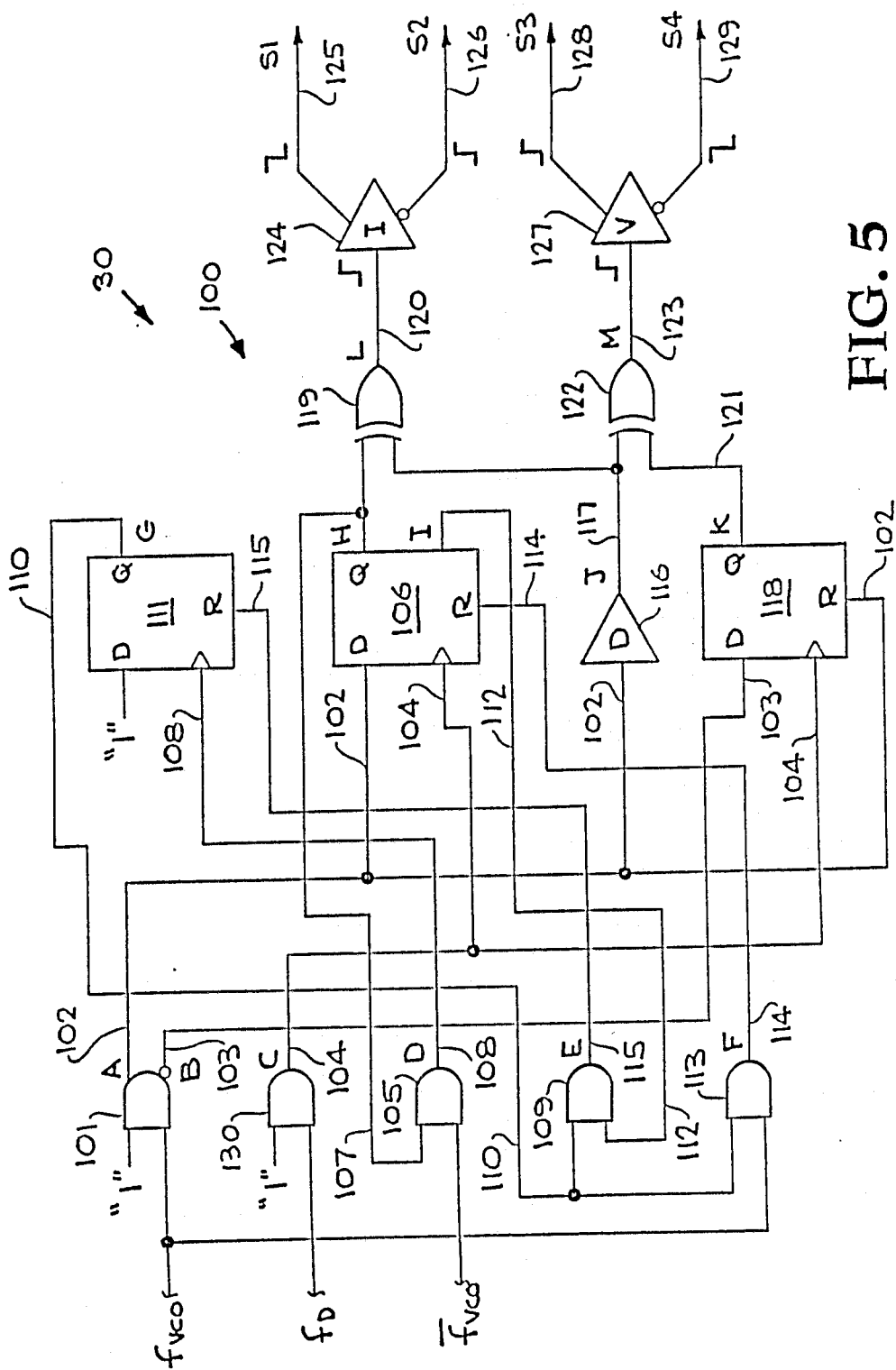
FIG. 5 is a logic diagram of a digital control circuit for the embodiment of FIG. 4.

FIG. 5 shows a logic circuit 100 used as control means 30 for generating the control signals S1, S2, S3, and S4 for controlling the charge pump apparatus shown in FIG. 4. The control signals S1, S2, S3, and S4 are generated in response to the difference in phase between a reference frequency signal $f_{VCO}$ and a data stream $f_D$. In addition to $f_{VCO}$ and $f_D$, the control means 30 also receives the complement $\bar{f}_{VCO}$.

The control means 30 includes a first AND gate 101 which supplies an output A on line 102. Alos, the first AND gate 101 supplies the complement of A, designated B, on line 103. The first AND gate 101 receives as input the reference frequency signal $f_{VCO}$ and a reference voltage corresponding to a "1", such as $V_{CC}$.

Also included is a second AND gate 130 receiving the data stream $f_D$ and a constant "1" as inputs and generating signal C as output on line 104.

A third AND gate 105 receives the complement of the reference frequency $\bar{f}_{VCO}$ as input and the positive output H from the flip-flop 106 which is described below across line 107. The third AND gate 105 generates an output signal D across line 108.

A fourth AND gate 109 receives as input across line 110 the output G of a flip-flop 111 (described below) and across line 112 the negative output I from the flip-flop 106. The fourth AND gate 109 generates the signal E across line 115.

A fifth AND gate 113 receives the signal G across line 110 output by the flip-flop 111 and the reference frequency signal $f_{VCO}$ as input. The fifth AND gate 113 generates a signal F across line 114.

The flip-flop 111 is clocked by the signal D from the third AND gate 105 across line 108. The flip-flop 111 is reset by the signal E from the fourth AND gate 109 across line 115. The D input to the flip-flop 111 is set at a constant high value so that each time the signal D goes from low to high, the output signal G on line 110 is set to a high value.

The flip-flop 106 receives as its D input the signal A across line 102. The flip-flop 106 is clocked by the signal C across line 104. The flip-flop 106 is reset by the signal F across line 114. The flip-flop 106 generates the signal H across line 107 and its complement I across line 112.

The logic circuit 100 includes a delay means 116 which receives the signal A across line 102 and generates a signal J on line 117 which is equal to A but delayed slightly so that the signal is synchronized with the output of the flip-flops 111, 106 and, as next described, 118.

The flip-flop 118 receives as its D input the signal B over line 103, is clocked by the signal C over line 104, and is reset by the signal A over line 102. The flip-flop 118 generates the signal K over line 121.

The signals H and J across lines 107 and 117, respectively, are received by a first exclusive OR gate 119 which generates an output signal L across line 120. Likewise, the signal J and K across lines 117 and 121, respectively, are received by a second exclusive OR gate 122 which generates an output signal M across line 123.

The output signal L across line 120 is received by an output signal driving circuit 124 which comprises a current switch which supplies a current S1 on line 125 and S2 on line 126. When the logic signal L swings high, the current S1 on line 125 swings low, which causes the first switch $SW_1$ to turn on, as can be seen with reference to FIG. 4. Likewise, the signal S2 is provided as the complement of S1, causing the switch $SW_2$ to turn off.

The signal M across line 123 is supplied to an output voltage driving circuit 127 which generates a voltage signal S3 across line 128 and a voltage signal S4 across line 129. When the level of the signal M swings high, the signal S3 swings high causing the switch $SW_3$ to turn on. Conversely, the signal S4 is the complement of S3, so the switch $SW_4$ turns off.

The operation of the logic circuit 100 of FIG. 5 is explained with reference to the timing diagram of FIG. 6. In the timing diagram of FIG. 6, the short delays occasioned by the components of the logic circuit 100 are ignored for the purpose of simplicity.

Figure 6:
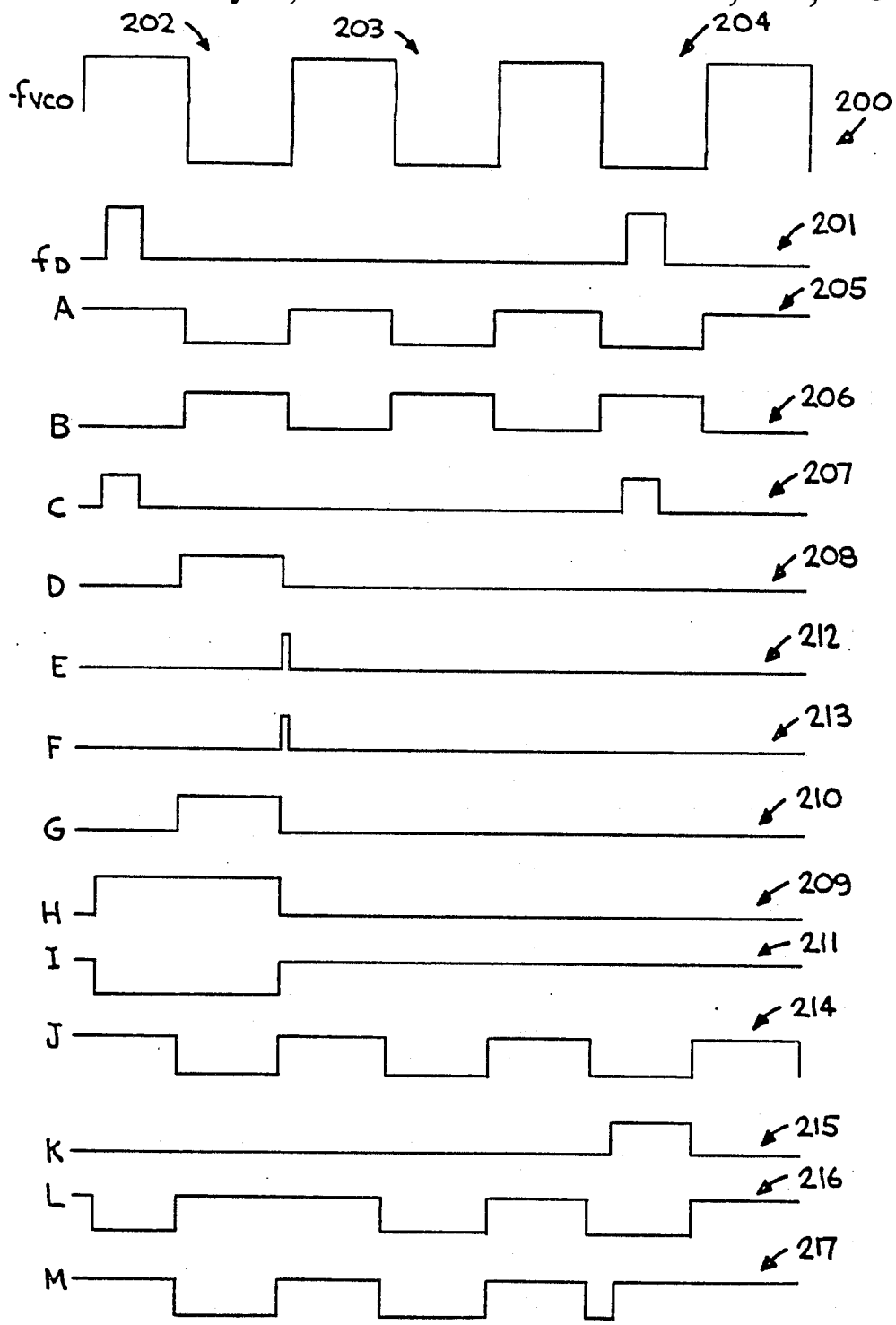
FIG. 6 is a timing diagram used to explain the operation of the circuit of FIG. 5.

FIG. 6 shows the reference frequency signal $f_{VCO}$ as a square wave 200. Also, the data stream $f_D$ is shown on line 201. The reference frequency $f_{VCO}$ and the data signal $f_D$ in FIG. 6 illustrate the three conditions of the digital phase detector. The first condition 202 shows a data pulse signal occurring during the first half-cycle pf the reference frequency signal $f_{VCO}$. The second condition 203 shows no data pulse signal during an entire period of the reference frequency signal $f_{VCO}$. The third condition 204 shows a data pulse signal occurring during the second half-cycle of a period of the reference frequency signal $f_{VCO}$.

The signal A on line 102 is high during the positive half-cycle of the reference frequency signal $F_{VCO}$ and low during the negative half-cycle as shown at line 205.

The signal B is a complement of the signal A as shown at line 206.

The signal C as shown at line 207 is high only during a data pulse and low for the rest of the time.

The signal D shown at line 208 goes high only during the second half-cycle of the reference frequency signal $f_{VCO}$ when a data pulse signal occurs during the first half-cycle of the given period. This is accomplished by the logic circuit 100 by making the signal D responsive to the output H of the flip-flop 106 shown on line 209. Since the flip-flop 106 is receiving the signal A at its D input on line 102 that is high during the first half-cycle of the reference frequency signal $f_{VCO}$, and because the data pulse signal clocks the flip-flop 106, the output H on line 107 of the flip-flop 106 will go high on the leading edge of the data pulse signal received during the first half-cycle of the reference frequency signal $f_{VCO}$.

When the signal D goes high, the flip-flop 111 is clocked across line 108 causing the output signal G on line 110 shown at 210 to go high.

The signal E goes high only when the signal G on line 110 and the signal I on line 112 are high. The signal I shown at 211 is a complement of the signal H and thus remains low until the flip-flop 106 is reset. When the signal E goes high as shown at 212, the flip-flop 111 is reset causing the signal G to go low.

Signal F resets the flip-flop 106 when the signal G is high during the first half-cycle of the reference frequency signal $f_{VCO}$. The signal F is shown at 213 in FIG. 6. Thus the signal F remains high only long enough to reset the flip-flop 111 driving G low and then F low.

As explained above, the signal J on line 117 equals the signal A across line 102 except delayed by the delay means 116 so that it is in time with the output of the flip-flops. Signal J is shown at 214 in FIG. 6.

The signal K is operable to be high only after a data pulse signal is received during the negative half-cycle of a reference frequency signal until the end of the second half-cycle. Signal K is shown at 215 in FIG. 6. The D input on line 103 of the flip-flop 118 is the B signal that is high only during the second half-cycle of the reference frequency signal $f_{VCO}$. The flip-flop 118 is clocked by the data pulse signal across line 104 and reset by the signal A across line 202.

The signal L is high only when the signals H and J are different and low when they are the same. Thus the signal L for the first condition 202, in which the data pulse signal is received during the first half-cycle of the reference frequency signal $f_{VCO}$, is high until the leading edge of the data pulse signal, at which time the signal H goes high while the signal J remains high. This causes the signal L to go low until the beginning of the second half-cycle of the reference frequency signal $f_{VCO}$. At this time while the signal H remains high, the signal J swings low causing the signal L to go high until the end of the period. During the second condition 203 in which no data pulse signal is received during the period of the reference frequency signal $f_{VCO}$, the signal L remains high during the first half-cycle of the reference frequency signal and then swings low during the second half-cycle of the reference frequency signal. This is so because the signal H remains low throughout the period while the signal J is high during the first-cycle and low during the second half-cycle.

In the third condition 204, a data pulse signal is received during the second half-cycle of a given period of the reference frequency signal $f_{VCO}$. In this condition the signal L remains high during the first half-cycle and then swings low during the second half-cycle of the reference frequency signal $f_{VCO}$ and returns high at the end of the second half-cycle. Signal L is shown at 216 in FIG. 6.

The signal M shown at 217 in FIG. 6 is high only when the signals J and K are different and low only when the signals J and K are the same. Thus the signal M, during condition 202 in which a data pulse signal is received during the first half-cycle of the reference frequency signal $f_{VCO}$, remains high during the first half-cycle and then swings low during the second half-cycle of the reference frequency signal. When no data pulse signal in condition 203 is received during a given period of the reference frequency signal $f_{VCO}$, the signal M likewise remains high during the first half-cycle and swings low during the second half-cycle. During the condition 204 in which a data pulse signal is received during the second half-cycle of the reference frequency signal $f_{VCO}$, the signal M remains high during the first half-cycle and swings low at the beginning of the second half-cycle of the reference frequency signal $f_{VCO}$. However, when the leading edge of the data pulse signal occurs, the signal M swings high and remains high until the end of the period.

Thus the signals L and M on lines 120 and 123 define the state of the switches SW₁, SW₂, SW₃ and SW₄ so that the switching means 16 is controlled to be in the first state, the second state, or the third state as shown in FIG. 3. As mentioned above, it is desirable in some embodiments that while the first state, the switching means alternates between the condition of having SW₁ and SW₃ closed while SW₂ and SW₄ are open to a condition of having SW₂ and SW₄ closed while SW₁ and SW₃ are open. The logic circuit 100 shown in FIG. 5 accomplishes this.

Thus the first state occurs when both L and M are high or when both L and M are low. When both L and M are high, SW₁ and SW₃ are closed or turned on while SW₂ and SW₄ are turned off. When both L and M are low, SW₂ and SW₄ are turned on while SW₁ and SW₃ are turned off.

The second state occurs when L is high and M is low. This causes SW₂ and SW₃ to turn on while switches SW₁ and SW₄ turn off.

The third state occurs when L is low and M is high. This causes switches SW₁ and SW₄ to turn on while switches SW₂ and SW₃ turn off. Thus is can be seen that the signals L and M shown in FIG. 6 will generate the state sequence shown in FIG. 3.

The present invention provides a low order charge-pump filter which operates with a current source means supplying current at a single node, thereby eliminating the need for current source matching of the prior art. Furthermore, the charge-pump filter 10 is operable over a wide range of frequencies by varying the reference current $I_{REF}$ in accordance with the desired data rate. In addition, when operable as a phase detector, the presence or absence of data pulses during a given bit-period is accounted for without the problems of prior art phase detectors.

The foregoing description of a preferred embodiment of the invention has been presented for the purposes of illustration and description. It is not intended to be exhaustive or to limit the invention to the precise form disclosed, and obviously many modifications and variations are possible in light of the above teaching. The phase-locked loop embodiment was chosen and described in order to best explain the principles of the invention and its practical application to thereby enable others skilled in the art to best utilized the invention in various embodiments and with various modifications, as are suited to the particular use contemplated. It is intended that the scope of the invention be defined by the claims appended hereto.

I claim:

1. A charge-pump apparatus for generating an output signal indicating a difference between a first signal and a second signal, comprising:

charge storage means connected across a first node and a second node for storing charge;

current source means for supplying a current at a third node, the current having a magnitude essentially independent of the charge stored in the charge storage means and a direction;

switching means, responsive to control signals, for controlling the supply of the current having the magnitude and direction to said first node and to said second node from said third node including a first switch connected from the first node to a reference voltage, a second switch connected from the second node to the reference voltage, a third switch connected from the first node to the third node, and a fourth switch connected from the second node to the third node; and control means for generating said control signals in response to the first signal and the second signal.

2. The apparatus of claim 1, wherein said current source means includes:

current scaling means for varying the magnitude of the current supplied by said current source means in response to a current control signal.

3. The apparatus of claim 1, further including:

means for generating an output signal indicating the difference in voltage between said first node and said second node.

4. The apparatus of claim 3, wherein said means for generating an output signal includes:

differential amplifier means for generating a differential signal proportional to the voltage across said first node and said second node.

5. The apparatus of claim 1, wherein said control means comprises:
a digital phase detector means for generating said control signals in response to the difference in phase between said first signal and said second signal.

6. The aparatus of claim 1, wherein the first signal and the second signal fall within a first frequency range or a second frequency range and said current source means comprises:
a first variable current source supplying a current having a first range of magnitude at the third node;
a second variable current source supplying a current having a second range of magnitude at the third node; whereby
the current in the first range of magnitude combined with the current in the second range of magnitude provide a first current adapted for the first frequency range and the current in the second range of magnitude provides a second current adapted for the second frequency range.

7. The apparatus of claim 6, wherein the current scaling means further includes:
means for varying the magnitudes of the first current and the second current supplied by said first and second variable current sources in response to the current control signal; and
clamp means for clamping said first variable current source on or off for controlling the frequency range of operation for the apparatus.

8. The apparatus of claim 1, wherein:
said switching means is operable in at least a first state, a second state, and a third state;
said first state for maintaining the charge in said charge storage means substantially constant;
said second state for pumping down the charge in said charge storage means; and
said third state for pumping up the charge in said charge storage means.

9. A phase detector apparatus for generating a phase error signal indicating a difference in phase between a frequency signal and a data signal wherein the frequency signal is periodic having periods with a first part and a second part and the data signal is a data stream that may or may not include a data pulse in a given period of the frequency signal, comprising:
charge storage means connected across a first node and a second node for storing charge;
current source means for supplying a current at a third node, the current having a magnitude essentially independent of the charge stored in the charge storage means;
switching means, responsive to control signals and interconnecting said first node and said third node and interconnecting said second node and said third node, for controlling the supply of current at said first and said second node from said third node, the switching means being operable in at least a first state, a second state, and a third state;
said first state for maintaining the charge in said charge storage means substantially constant;
said second state for pumping down the charge in said charge storage means; and
said third state for pumping up the charge in said charge storage means; and control means for generating said control signals in response to the frequency signal and the data signal wherein
said control means switches said switching means to said first state if no data pulse is received during a given period;
said control means switches said switching means to said third state when a data pulse is received during the first part of a given period, then to said second state for the second part of the given period until the beginning of a next period; and
said control means switches said switching means to said third state when a data pulse is received during the second part of a given period until the beginning of the next period.

10. The apparatus of claim 9, wherein the data signal has a nominal data rate and said correct source means includes:
current scaling means for varying the magnitude of the current supplied at the third node in response to the nominal data rate of the data signal.

11. The apparatus of claim 9, further including:
means for generating an output signal indicating the difference in voltage between said first node and said second node.

12. The apparatus of claim 11, wherein said means for generating an output signal includes:
diffrential amplifier means for generating a differential signal proportional to the difference in voltage between said first node and second node.

13. The apparatus of claim 9, wherein said control means comprises:
a digital phase detector means for generating said control signals in response to the difference in phase of said frequency signal and said data signal.

14. The apparatus of claim 9, wherein the first signal and the second signal fall within a first frequency range or a second frequency range and said current source means comprises:
a first variable current source supplying a current having a first range of magnitude at the third node;
a second variable current source supplying a current having a second range of magnitude at the third node; whereby
the current in the first range of magnitude combined with the current in the second range of the magnitude provide a first current adapted for the first frequency range and the current in the second range of magnitude provides a second current adapted for the second frequency range.

15. The apparatus of claim 14, wherein said current scaling means further includes:
means for varying the first current and the second current supplied by said first and second variable current sources in response to a current control signal; and
clamp means for clamping said first variable current source on or off for controlling the frequency range of operation for the apparatus.

16. The apparatus of claim 9, wherein said switching means includes:
a first switch connected from the first node to a reference voltage, a second switch connected from the second node to the reference voltage, a third switch connected from the first node to the third node, and a fourth switch connected from the second node to the third node.

17. An integrated circuit generating an analog phase error signal in response to digital control signals, the digital control signals indicating the difference in phase between a frequency signal and a data signal having a nominal data rate, comprising:

charge storage means connected across a first node and a second node for storing charge;

current source means for supplying a current at a third node, including current scaling means for varying the current supplied in response to the nominal data rate of the data signal;

switching means, responsive to the digital control signals and interconnecting the first node and the third node and interconnecting the second node and the third node, for controlling the supply of current at said first node and said second node in three states, the three states including a first state in which the charge in said charge storage means is maintained substantially constant;

a second state in which the charge in said charge storage means is pumped down; and a third state in which the charge in said charge storage means is pumped up.

18. The apparatus of claim 17, further including:

means for generating the analog phase error signal in response to the difference in voltage between said first node and said second node.

19. The apparatus of claim 18, wherein said means for generating the analog phase error signal includes:

differential amplifier means for generating a differential current signal proportional to the voltage between said first node and said second node.

20. The apparatus of claim 17, wherein said current source means comprises:

a first variable current source and a second variable current source operable in conjunction to provide a first current for a first frequency range of operation or a second current for a second frequency range of operation.

21. The apparatus of claim 20, wherein said current scaling means includes:

means for varying the first current and the second current supplied by said first variable current source and said second variable current source, respectively, in response to a current control signal; and clamp means for clamping at least one of said first variable current source and said second variable current source on or off for controlling the frequency range of operation for the apparatus.

22. The apparatus of claim 17 wherein said switching means includes:

a first switch connected from the first node to a reference voltage, a second switch connected from the second node to the reference voltage, a third switch connected from the first node to the third node, and a fourth switch connected from the second node to the third node.

23. The apparatus of claim 17, wherein the frequency signal is periodic having periods with a first half and a second half and the data signal is a data stream that may or may not include a data pulse in a given period of the frequency signal.

24. The apparatus of claim 23, wherein:

said control means switches said switching means to said first state if no data pulse is received during a given period;

said control means switches said switching means to said third state when a data pulse is received during the first half of a given period, then to said second state for the second half of the given period until the beginning of a next period; and said control means switches said switching means to said third state when a data pulse is received during the second half of a given period until the beginning of a next period.

25. A charge-pump apparatus for generating an output signal indicating a difference between a first signal and a second signal, comprising:

charge storage means connected across a first node and a second node for storing charge;

current source means for supplying a current having a magnitude and a direction at a third node, including current scaling means for varying the magnitude of the current supplied at said third node in response to a current control signal;

switching means, responsive to control signals, for controlling the supply of current to said first node and to said second node from said third node; and control control means for generating said control signals in response to the first signal and the second signal.

26. A phase detector apparatus for generating a phase error signal indicating a difference in phase between a frequency signal and a data signal, comprising:

charge storage means connected across a first node and a second node for storing charge;

current source means for supplying a current having a magnitude and a direction at a third node, including current scaling means for varying the magnitude of the current supplied at said third node in response to a current control signal;

switching means, responsive to control signals and interconnecting said first node and said third node and interconnecting said second node and said third node, for controlling the supply of current to said first and to said second node; and control means for generating said control signals in response to the frequency signal and the data signal.

* * * * *